United States Patent
Sato

(10) Patent No.: US 12,224,030 B2
(45) Date of Patent: Feb. 11, 2025

(54) MEMORY SYSTEM

(71) Applicant: Winbond Electronics Corp., Taichung (TW)

(72) Inventor: Takahiko Sato, Yokohama (JP)

(73) Assignee: WINDBOND ELECTRONICS CORP., Taichung (TW)

(*) Notice: Subject to any disclaimer, the term of this patent is extended or adjusted under 35 U.S.C. 154(b) by 227 days.

(21) Appl. No.: 17/987,435

(22) Filed: Nov. 15, 2022

(65) Prior Publication Data

US 2023/0197184 A1  Jun. 22, 2023

(30) Foreign Application Priority Data

Dec. 17, 2021 (JP) ................................. 2021-204736

(51) Int. Cl.
  *G11C 29/52* (2006.01)
  *G11C 11/4093* (2006.01)
  *G11C 11/4096* (2006.01)

(52) U.S. Cl.
  CPC .......... *G11C 29/52* (2013.01); *G11C 11/4093* (2013.01); *G11C 11/4096* (2013.01)

(58) Field of Classification Search
  CPC . G11C 29/52; G11C 11/4093; G11C 11/4096; G11C 7/1063; G11C 7/109; G11C 2029/0409; G11C 2029/0411; Y02D 10/00

(Continued)

(56) References Cited

U.S. PATENT DOCUMENTS 10,579,470 B1 * 3/2020 MacLaren ............ G06F 11/1048
2004/0153939 A1   8/2004 Aoyama et al.
(Continued)

FOREIGN PATENT DOCUMENTS

CN    1451115 A    10/2003
JP    5-158808 A    6/1993
(Continued)

OTHER PUBLICATIONS

Japanese Office Action for Japanese Application No. 2021-204736, dated Aug. 8, 2023, with an English translation.

(Continued)

*Primary Examiner* — Hoai V Ho
*Assistant Examiner* — Minh Dinh
(74) *Attorney, Agent, or Firm* — Birch, Stewart, Kolasch & Birch, LLP

(57) ABSTRACT

The present invention provides a memory system in which a semiconductor memory device can be accessed properly. The memory system includes a memory controller and a semiconductor memory device. The memory controller sends a command, an address, and first checking data to the semiconductor memory device. When the semiconductor memory device receives first response information that indicates that no error has been detected, it sends or receives read data or write data from the semiconductor memory device. When the semiconductor memory device receives the command, the address, and the first checking data, it uses the first checking data to detect errors in the command and the address, and sends the first reply information when no error is detected, and when no error is detected in the command and the address, it sends or receives read data or write data from the semiconductor memory device.

20 Claims, 11 Drawing Sheets

(58) Field of Classification Search
USPC .......................................................... 365/185
See application file for complete search history.

(56) References Cited

U.S. PATENT DOCUMENTS

| | | | |
|---|---|---|---|
| 2017/0063486 A1 | 3/2017 | Shiraishi et al. | |
| 2017/0371654 A1* | 12/2017 | Bajic | G06F 9/3888 |
| 2018/0088848 A1 | 3/2018 | Lee | |
| 2019/0012296 A1* | 1/2019 | Hsieh | G06N 3/04 |
| 2019/0303282 A1 | 10/2019 | Kim et al. | |

FOREIGN PATENT DOCUMENTS

| | | |
|---|---|---|
| JP | 6-124243 A | 5/1994 |
| JP | 2000-32085 A | 1/2000 |
| JP | 2002-63791 A | 2/2002 |
| JP | 2004-193664 A | 7/2004 |
| JP | 2013-29882 A | 2/2013 |
| JP | 2014-48881 A | 3/2014 |
| JP | 2020-149123 A | 9/2020 |
| TW | I459391 B | 11/2014 |
| TW | 202027085 A | 7/2020 |
| TW | 202137230 A | 10/2021 |
| TW | 202147118 A | 12/2021 |

OTHER PUBLICATIONS

Korean Office Action for Korean Application No. 10-2022-0012732, dated Sep. 16, 2023, with an English translation.
Japanese Office Action for Japanese Application No. 2021-204736, dated Feb. 7, 2023, with an English translation.

* cited by examiner

MEMORY SYSTEM

CROSS REFERENCE TO RELATED APPLICATIONS

This application claims priority of Japanese Patent Application No. JP2021-204736, filed on Dec. 17, 2021, the entirety of which is incorporated by reference herein.

BACKGROUND OF THE INVENTION

Field of the Invention

The present invention relates to a memory system including a memory controller and a semiconductor memory device.

Description of the Related Art

Memory systems including semiconductor memory devices, such as dynamic random access memory (DRAM), and the memory controllers that control the writing to, or reading from, the semiconductor memory device, are well known (e.g. refer to Japanese Patent No. JP2002-63791). These semiconductors are configured to read or write data in memory areas (e.g. memory cells) at corresponding addresses while receiving command packets that include commands and addresses based on the contents of the commands (e.g. read commands or write commands).

However, in conventional memory systems, when sending the command packets from the memory controller to the semiconductor memory device, the contents or the addresses of the commands may change if an error occurs in the commands or the addresses. Thus, there is a concern that access to the semiconductor memory device may be difficult to perform properly.

BRIEF SUMMARY OF THE INVENTION

An embodiment of the present invention provides a memory system including a memory controller and a semiconductor memory device. The memory controller is configured to send a command and an address and first check data for an error detection of the command and the address to the semiconductor memory device, and to send to or receive from the semiconductor memory device of the data read from or written to the address based on the command when receiving first response information from the semiconductor memory device indicating that no error has been detected in the command and the address. The semiconductor memory device is configured to, when receiving the command, the address and the first check data from the memory controller, use the first check data to perform the error detection of the command and the address, send the first response information to the memory controller if no error is detected in the command and the address, and send to or receive from the memory controller of the data read from or written to the address based on the command.

The memory system according to the invention may properly access the semiconductor memory device.

DETAILED DESCRIPTION OF THE INVENTION

First Embodiment

Figure 1:
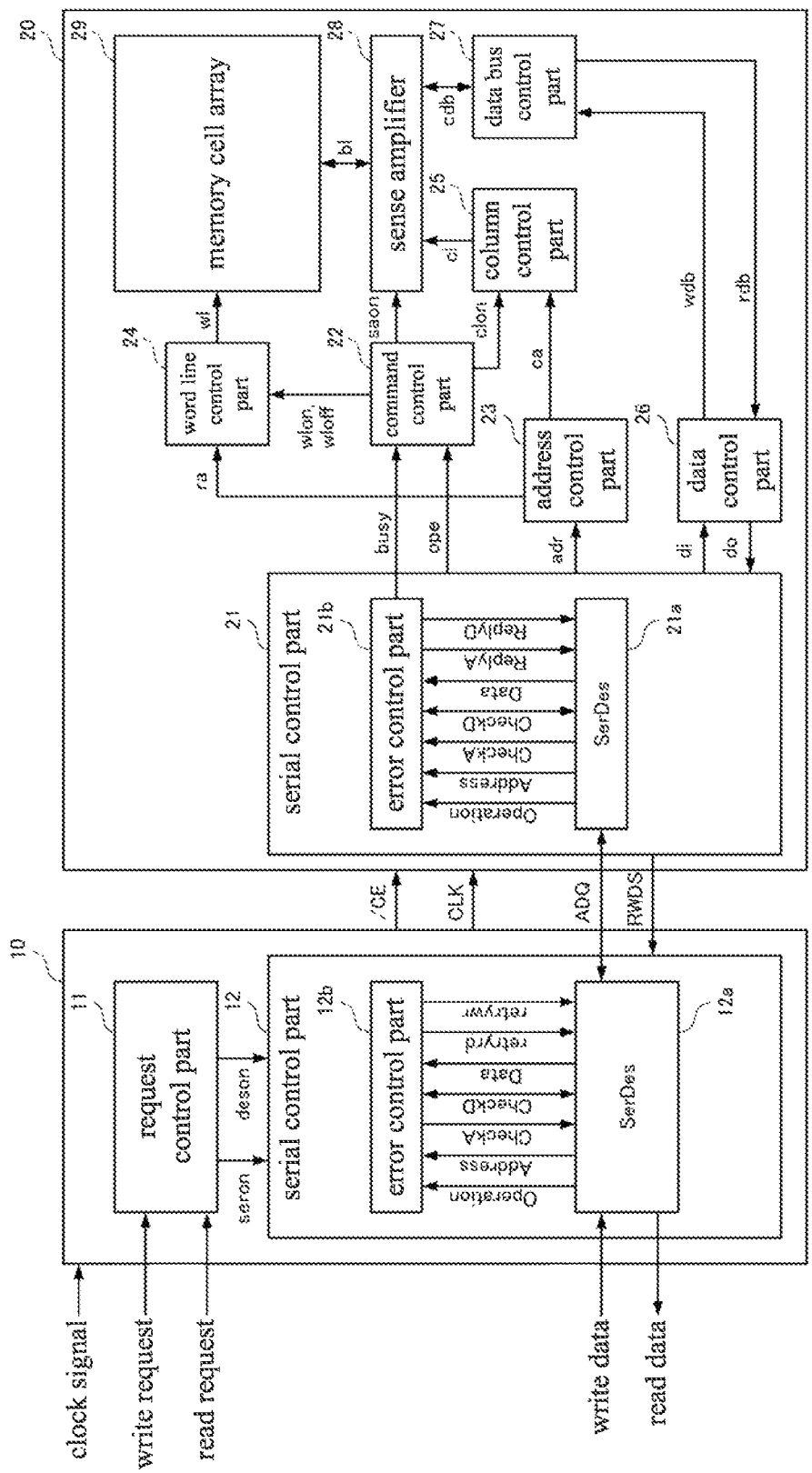
FIG. 1 shows a block diagram illustrating an exemplary configuration of a memory system associated with a first embodiment of the present invention.

FIG. 1 shows a memory system including a memory controller 10 and a semiconductor memory device 20. In this embodiment, the following discussion is based on an example in which the semiconductor memory device 20 is a pseudo-static random access memory (pSRAM). Herein, the pSRAM is a semiconductor memory device that includes an interface compatible with a static random access memory (SRAM). Moreover, the pSRAM uses dynamic random access memories (DRAM) as memory cells to memorize data, wherein the access interface of the DRAM is re-designed to make it compatible with the access interface of a SRAM. In this embodiment, an example in which the semiconductor memory device 20 is a clock-synchronous pSRAM that receives signals synchronously with a clock signal and an address data multiplex interface pSRAM is shown. The address data multiplex interface pSRAM has an address data terminal configured to input each address signal and data signal. Also, in the pSRAM of this embodiment, although the shown example uses double data rate (DDR) as the data-sending method, the pSRAM may use single data rate (SDR) as well.

The memory controller 10 is configured to send a command (shown as Operation in the figure), an address (shown as Address in the figure), and first check data (shown as CheckA in the figure) for the error detection of the command and the address to the semiconductor memory device 20, and, when receiving first response information (shown as ReplyA(OK) in the figure) indicating that no error has been detected in the command and the address from the semiconductor memory device 20, send to or receive from the semiconductor memory device 20 of the data (shown as Data in the figure) read from or written to the address. On the other hand, the semiconductor memory device 20 is configured to use the first check data to perform the error detection of the command and the address when receiving the command, the address and the first check data from the memory controller 10, and, if no error is detected in the command and the address, send the first response information (ReplyA(OK)) to the memory controller 10, and send to or receive from the memory controller 10 of the data read from or written to the address based on the command.

Furthermore, the semiconductor memory device 20 is configured to send second response information (shown as ReplyA(NG) in the figure) indicating that an error has been detected in the command or the address to the memory controller 10 when an error is detected in the command or the address. On the other hand, the memory controller 10 is configured to, when receiving the second response data (ReplyA(NG)) from the semiconductor memory device 20, re-send the command and the address to the semiconductor memory device 20, so as to re-access the semiconductor memory device 20 from the beginning.

Furthermore, the memory controller 10 (either the memory controller or the semiconductor memory device 20) is configured to send the written data and second check data (shown as CheckD in the figure) for the error detection of the data to the semiconductor memory device 20 (the other of the memory controller 10 or the semiconductor memory device 20). On the other hand, the semiconductor memory device 20 is configured to, when receiving the data and the second check data (CheckD), perform the error detection of the data using the second check data, and send third response information (shown as ReplyD(OK) in the figure) indicating that no error has been detected in the data to the memory controller 10 if no error is detected in the data. In such cases, the persistence of the status that the data to be read or write includes an error may be inhibited, allowing the completeness of the data to be maintained.

Furthermore, the semiconductor memory device 20 (the other of the memory controller 10 or the semiconductor memory device 20) is configured to send fourth response information (shown as ReplyD(NG) in the figure) indicating that an error has been detected in the data to the memory controller 10 (either the memory controller or the semiconductor memory device 20) when an error is detected in the data, and wait for re-sending data from the memory controller 10 until a specific time duration elapses, so as to continue the writing operation associated with the data. Thus, the access efficiency is increased compared to cases that involve restarting the access associated with the writing operation of the data from the beginning. On the other hand, the memory controller 10 (either the memory controller or the semiconductor memory device 20) is configured to, when receiving the fourth response information (ReplyD (NG)), re-send the data and the second check data corresponding to the data to the semiconductor memory device 20 (the other of the memory controller 10 or the semiconductor memory device 20). Thus, when an error is detected in the data, the writing operation of the data may be performed again through the data re-sending of the memory controller 10.

Furthermore, the semiconductor memory device 20 (the other of the memory controller 10 or the semiconductor memory device 20) is configured to terminate the waiting for the re-sending of the data if no re-sending of the data is performed from the memory controller 10 (either the memory controller 10 or the semiconductor memory device 20) until a specific time duration has elapsed. Thus, when no data is re-sent, by terminating the waiting for the re-sending of the data, the semiconductor memory device 20 may process other read or write access so as to increase the process performance of access.

The memory controller 10 is connected to an external host device (omitted in the figure) and, in response to a command from the host device, performs an access operation such as read or write to the semiconductor memory device 20. For example, when the memory controller 10 receives a write request for writing data into the semiconductor memory device 20 or a read request for reading data from the semiconductor memory device 20 from the host device, it asserts a chip select signal/CE (into the logic low level) and sends the chip select signal/CE to the semiconductor memory device 20. Also, the memory controller 10 uses a clock signal received from the host device as an external clock signal CLK, and sends the external clock signal CLK to the semiconductor memory device 20.

The memory controller 10 includes a request control part 11 and a serial control part 12. Alternatively, the request control part 11 and the serial control part 12 may be comprised of specific hardware devices, logic circuits, or the like.

The memory controller 10 may also include a central processing unit (CPU, omitted in the figure), memory devices such as random access memories (RAM, omitted in the figure), and interfaces (omitted in the figure) for the sending and receiving of signals with the semiconductor memory device 20 and various host devices. For example, the CPU of the memory controller 10 may also implement the function of the request control part 11 and the serial control part 12 by reading and executing a computer program memorized in a memory device.

The request control part 11 is configured to, when receiving the request to write into or read from the semiconductor memory device 20 from the host device, generate a transform signal for transforming the sending mode of an address data signal ADQ sending or receiving between the memory controller 10 and the semiconductor memory device 20. Specifically, the request control part 11 outputs a transform signal deson to the serial control part 12 when receiving a write request for writing data into the semiconductor memory device 20, the transform signal deson transforms (de-serializes) the address data signal ADQ sent from the memory controller 10 to the semiconductor memory device 20 from a serial transmission mode to a parallel transmission mode of a specific number of bits (e.g. 8 bits).

Furthermore, when the request control part 11 is receiving the read request to read data from the semiconductor memory device 20, the request control part 11 outputs a transform signal seron to the serial control part 12, the transform signal seron transforms (serializes) the signal (e.g. the data to be read) sent from the semiconductor memory device 20 to the memory controller 10 from the parallel transmission mode to the serial transmission mode.

The serial control part 12 is configured to transform the sending mode of the address data signal ADQ based on the transform signal deson. Additionally, the serial control part 12 includes a serializer/deserializer (SerDes) 12a and an error control part 12b. SerDes 12a makes the signal sent or received between the memory controller 10 and the semiconductor memory device 20 transform between the serial transmission mode and the parallel transmission mode. Additionally, although the present embodiment is described with an example in which the SerDes 12a writes data in de-serialized manner and reads data in serialized manner, the SerDes 12a may alternatively be configured to write data in serialized manner, e.g. from 64-bit to 8-bit, and read data in de-serialized manner. Furthermore, the serial control part 12 is an example of a "first serial control part" of the present invention, SerDes 12a is an example of a "first serializer/deserializer" of the present invention.

For example, in case where the request control part 11 receives a write request or a read request, when the transform signal deson is input from the request control part 11, the SerDes 12a generates a read command or a write command (Operation) and an address (Address), and outputs Operation and Address to the error control part 12b. Then, when first check data (CheckA) for error detection of Operation and Address is input from the error control part 12b, the SerDes 12a transforms the command, the address and the first check data into the parallel transmission mode. Subsequently, the SerDes 12a sends the command, the address and the first check data send to the semiconductor memory device 20 as the address data signal ADQ.

Additionally, in case where the SerDes 12a receives first response information (ReplyA(OK)) indicating that no error has been detected in the write command and the address as the address data signal ADQ from the semiconductor memory device 20, the SerDes 12a outputs the data to be written (Data) received from the host device to the error control part 12b. Then, when second check data (CheckD) for error detection of the data to be written (Data) is input from the error control part 12b, the SerDes 12a transforms the second check data (CheckD) and the data to be written (Data) into the parallel transmission mode. Subsequently, the SerDes 12a sends the second check data (CheckD) and the data to be written (Data) to the semiconductor memory device 20 as the address data signal ADQ.

Furthermore, in cases where the SerDes 12a receives second response information (ReplyA(NG)) indicating that an error has been detected in the write command or the address as the address data signal ADQ from the semiconductor memory device 20, when a signal retrywr for re-sending the write command, the address and the first check data is input from the error control part 12b, the SerDes 12a re-sends the write command, the address and the first check data to the semiconductor memory device 20 as the address data signal ADQ.

Furthermore, in cases where the SerDes 12a receives second response information (ReplyA(NG)) indicating that an error has been detected in the read command or the address as the address data signal ADQ from the semiconductor memory device 20, when a signal retryrd for re-sending the read command, the address and the first check data is input from the error control part 12b, the SerDes 12a re-sends the read command, the address and the first check data to the semiconductor memory device 20 as the address data signal ADQ.

In addition, in cases where the SerDes 12a receives fourth response information (ReplyD(NG)) indicating that an error has been detected in the data to be written (Data) as the address data signal ADQ from the semiconductor memory device 20, the SerDes 12a re-sends the data to be written (Data) and the second check data (CheckD) corresponding to the data to be written (Data) to the semiconductor memory device 20 as the address data signal ADQ.

For example, the second check data (CheckD) and the first check data (CheckA) may be configured as a parity-check code or a cyclic redundancy checking (CRC) code.

Next, an explanation of the semiconductor memory device 20 including a serial control part 21, a command control part 22, an address control part 23, a word line control part 24, a column control part 25, a data control part 26, a data bus control part 27, a sense amplifier 28 and a memory cell array 29 is provided. The parts 21 to 29 within the semiconductor memory device 20 may also be comprised of specific hardware devices or logic circuits.

The serial control part 21 is configured to transform the sending mode of the address data signal ADQ sent and received between the serial control part 21 and the memory controller 10. Furthermore, the serial control part 21 includes a SerDes 21a and an error control part 21b. Like the SerDes 12a of the memory controller 10, the SerDes 21a makes the signal sent or received between the memory controller 10 and the semiconductor memory device 20 transform between the serial transmission mode and the parallel transmission mode. Additionally, the serial control part 21 is configured to send a data strobe signal RWDS to the serial control part 12 of the memory controller 10. Also, in the present embodiment, the serial control part 21 is an example of a "second serial control part" of the present invention, the SerDes 21a is an example of a "second serializer/deserializer" of the present invention, and the error control part 21b is an example of a "second error control part" of the present invention.

The SerDes 21a transforms the command, the address and the first check data into the serial transmission mode and outputs them to the error control part 21b when receiving the command, the address and the first check data from the memory controller 10 as the address data signal ADQ. The error control part 21b uses the first check data to perform the error detection of the command and the address. When no error is detected in the command and the address (Address), the error control part 21b outputs first response information (ReplyA(OK)) indicating that no error has been detected in the command and the address (Address) to the SerDes 21a.

When the first response information (ReplyA(OK)) indicating that no error has been detected in the command and the address (Address) is input from the error control part 21b, the SerDes 21a transforms the first response information (ReplyA(OK)) into the parallel transmission mode, and sends the first response information (ReplyA(OK)) to the memory controller 10 as the address data signal ADQ. Additionally, in such cases, the SerDes 21a outputs a signal ope indicating the content of the received command (a read command or a write command) to the command control part 22, and outputs a signal adr indicating the received address to the address control part 23.

On the other hand, when an error is detected in the command or the address (Address), the error control part 21b outputs second response information (ReplyA(NG)) indicating that an error has been detected in the command or the address (Address) to the SerDes 21a. When the second response information (ReplyA(NG)) indicating that an error has been detected in either the command or the address (Address) is input from the error control part 21b, the SerDes 21a transforms the second response information (ReplyA(NG)) into the parallel transmission mode, and sends the second response information (ReplyA(NG)) to the memory controller 10 as the address data signal ADQ.

Furthermore, when receiving the second check data and the data to be written as the address data signal ADQ from the memory controller 10, the SerDes 21a transforms the second check data and the data to be written into the serial transmission mode and sends them to the error control part 21b. The error control part 21b uses the second check data to perform the error detection of the data to be written. When no error is detected in the data to be written, the error control part 21b outputs third response information (ReplyD(OK)) indicating that no error has been detected in the data to be written to the SerDes 21a.

When the third response information (ReplyD(OK)) indicating that no error has been detected in the data to be written is input from the error control part 21b, the SerDes 21a transforms the third response information (ReplyD(OK)) into the parallel transmission mode and sends the third response information (ReplyD(OK)) to the memory controller 10 as the address data signal ADQ. Additionally, in such cases, the SerDes 21a outputs a signal di indicating the received data to the data control part 26.

On the other hand, when an error is detected in the data to be written, the error control part 21b outputs fourth response information (ReplyD(NG)) indicating that an error has been detected in the data to be written to the SerDes 21a. When the fourth response information (ReplyD(NG)) indicating that an error has been detected in the data to be written is input from the error control part 21b, the SerDes 21a transforms the fourth response information (ReplyD(NG)) into the parallel transmission mode, and sends the fourth response information (ReplyD(NG)) to the memory controller 10 as the address data signal ADQ.

Furthermore, when a signal do indicating the data to be read is input from the data control part 26, the SerDes 21a outputs the data to be read to the error control part 21b. Then, when inputting the second check data for the error detection of the data to be read from the error control part 21b, the SerDes 21a transforms the data to be read and the second check data into the parallel transmission mode, and sends the data to be read and the second check data to the memory controller 10 as the address data signal ADQ.

Furthermore, when the chip select signal/CE changes from negate (high logic level) to assert (low logic level), the error control part 21b asserts (into logic high level) a signal busy indicating the signal in process (performing read or write access), and outputs the signal busy to the command control part 22. The command control part 22 is configured to generate an internal command based on the command input from the memory controller 10. Specifically, when the asserted signal busy is input from the serial control part 21, the command control part 22 generates the internal command in response to the signal ope input from the serial control part 21. Herein, the generated internal command includes, for example, a read signal, a write signal, an update signal, or the like. In response to the generated internal command, the command control part 22 asserts a signal wlon for activating a word line and outputs the signal wlon to the word line control part 24, asserts a signal clon for activating a bit line and outputs the signal don to the column control part 25, and asserts a signal saon for activating the sense amplifier 28 and outputs the signal saon to the sense amplifier 28. Additionally, the command control part 22 asserts a signal wloff for deactivating the word line and outputs the signal wloff to the word line control part 24.

The address control part 23 is configured to, based on the address input from the memory controller 10, control the activation of the word line and the bit line corresponding to the address. Specifically, when the signal adr is input from the serial control part 21, the address control part 23 generates a row address signal ra indicating the activated word line, and a column address signal ca indicating the activated bit line. Then, the address control part 23 outputs the generated row address signal ra to the word line control part 24, and outputs the generated column address signal ca to the column control part 25.

When the asserted signal wlon is input from the command control part 22, the word line control part 24 outputs a signal wl for activating the word line indicated by the row address signal ra input from the address control part 23 to the memory cell array 29, so as to activate (i.e. drive) the word line. Additionally, when the asserted signal wloff is input from the command control part 22, the word line control part 24 outputs the signal wl for deactivating the word line to the memory cell array 29, so as to deactivate the word line.

When the asserted signal clon is input from the command control part 22, among a plurality of bit lines within the memory cell array 29, the column control part 25 outputs a signal ci for activating the bit line indicated by the column address signal ca input from the address control part 23 to the sense amplifier 28.

When the signal di indicating the data to be written is input from the serial control part 21, the data control part 26 outputs a signal wdb indicating the data to be written to the data bus control part 27. Additionally, when a signal rdb indicating the data to be read is input from the data bus control part 27, the data control part 26 outputs the signal do indicating the data to be read to the serial control part 21.

When the signal wdb indicating the data to be written is input from the data control part 26, the data bus control part 27 outputs a signal cdb indicating the data to be written to the sense amplifier 28. Additionally, when a signal cdb indicating the data to be read is input from the sense amplifier 28, the data bus control part 27 outputs the signal rdb indicating the data to be read to the data control part 26.

When the asserted signal saon is input from the command control part 22, the sense amplifier 28 outputs a signal bl for activating the bit line indicated by the signal ci input from the column control part 25 to the memory cell array 29, so as to activate (i.e. drive) the bit line. Then, the sense amplifier 28 performs data read or write operation to the memory cell via the activated bit line. For example, the sense amplifier 28 writes the signal cdb input from the data bus control part 27 indicating the data to be written to the memory cell via the activated bit line. Additionally, the sense amplifier 28 outputs the data read from the memory cell to the data bus control part 27 via the activated bit line.

The memory cell array 29 includes a plurality of memory cells (omitted in the figure) arranged in an array. In each memory cell, the data input from the memory controller 10 is memorized. Each memory cell may be a well-known 1T1C (one transistor and one capacitor) memory cell. Additionally, each memory cell is connected to any one of a plurality of word lines and any one of a plurality of bit lines.

Figure 2:
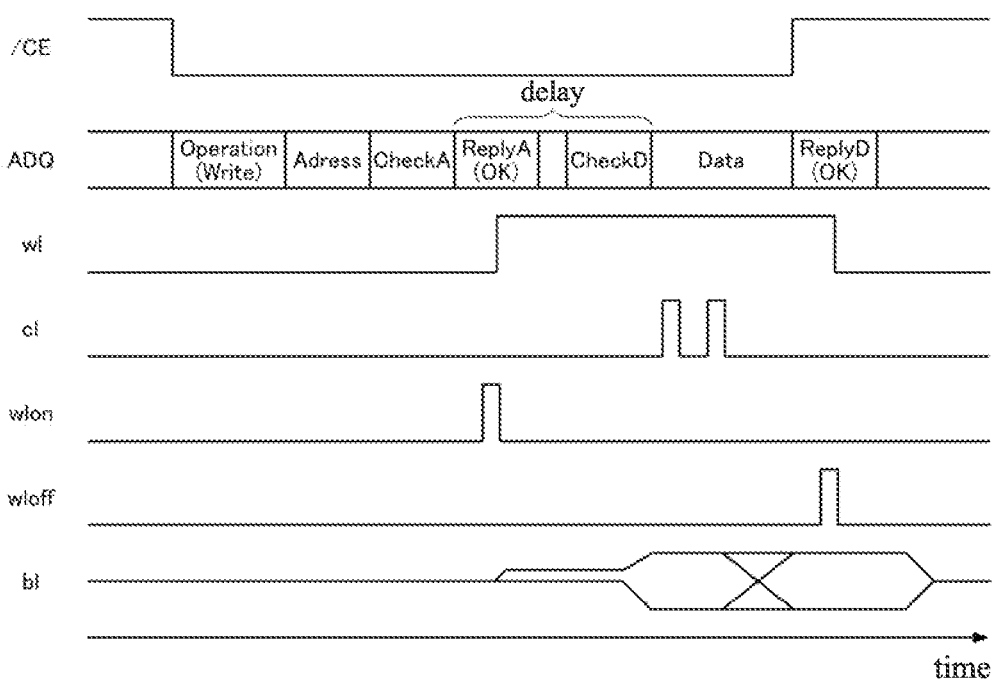
FIG. 2 shows a timing diagram of the signals within a semiconductor memory device over time when no error is included in the command and the address.

Referring to FIG. 2, an example in which a write command is input from the memory controller 10 is explained.

First, when receiving the command, the address and the first check data from the memory controller 10, the semiconductor memory device 20 uses the first check data to perform the error detection of the command and the address. Then, when no error is detected, the semiconductor memory device 20 sends the first response information (ReplyA(OK)) indicating that no error has been detected in the command and the address to the memory controller 10. Additionally, the first response information (ReplyA(OK)) may also be sent between the input of the command and the address and the input or output of the data.

Furthermore, when no error is detected in the command and the address, the semiconductor memory device 20 asserts (into logic high level) the signal wlon. In such cases, the signal wl for activating the word line of the corresponding address is asserted (into logic high level).

On the other hand, when receiving the first response information (ReplyA(OK)), the memory controller 10 sends the second check data and the data to be written to the semiconductor memory device 20. Additionally, the second check data may also be sent during the delay.

When receiving the second check data and the data to be written, the semiconductor memory device 20 uses the second check data to perform the error detection of the data to be written. Additionally, the semiconductor memory device 20 asserts (into logic high level) the signal cl of the bit line of the corresponding address. At this time, the sense amplifier 28 of the semiconductor memory device 20 may write the data to be written into the memory cell within the memory cell array 29 by activating the bit line of the corresponding address.

Furthermore, when negating (into logic high level) the chip select signal /CE after receiving the data to be written, the semiconductor memory device 20 sends the response information indicating whether an error is detected in the data to be written (the third response information (ReplyD(OK)) or the fourth response information (ReplyD(NG))) to the memory controller 10.

Additionally, when the data to be written is correctly written into the memory cell within the memory cell array 29, the semiconductor memory device 20 asserts (into logic high level) the signal wloff. Thus, the signal wl is negated (into logic low level). As such, when receiving the first response information (ReplyA(OK)) indicating that no error has been detected in the command and the address from the semiconductor memory device 20, the memory controller 10 may send the data to be written to the address to or from the semiconductor memory device 20.

Figure 3:
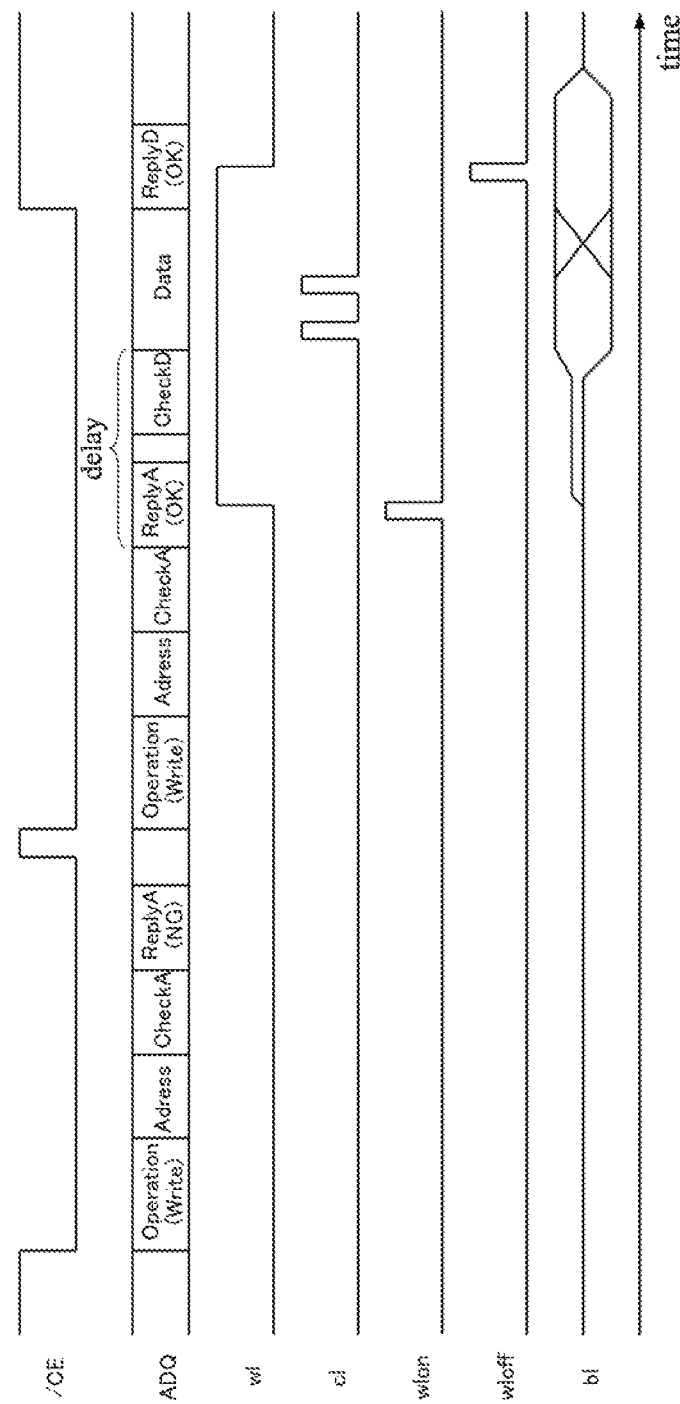
FIG. 3 shows a timing diagram of the signals within a semiconductor memory device over time when any of the command and the address includes an error.

Referring to FIG. 3, an example in which a write command is input from the memory controller 10 is explained.

First, when receiving the command, the address and the first check data from the memory controller 10, the semiconductor memory device 20 uses the first check data to perform the error detection of the command and the address. Then, when an error is detected, the semiconductor memory device 20 sends the second response information (ReplyA(NG)) indicating that an error has been detected in the command or the address to the memory controller 10. Additionally, in such cases, the semiconductor memory device 20 does not perform the activation of the word line or the bit line of the corresponding address.

On the other hand, when receiving the second response information (ReplyA(NG)), the memory controller 10 re-sends the command, the address and the first check data to the semiconductor memory device 20.

When receiving the re-sent command, the address and the first check data from the memory controller 10, the semiconductor memory device 20 uses the first check data to perform the error detection of the command and the address. Then, when no error is detected, the semiconductor memory device 20 sends the first response information (ReplyA(OK)) indicating that no error has been detected in the command and the address to the memory controller 10. Additionally, the subsequent operation of the semiconductor memory device 20 is same as the example shown in FIG. 2.

By re-sending the command and the address from the memory controller 10 to the semiconductor memory device 20 when an error is detected in the command and the address, the semiconductor memory device 20 may prevent from starting false operations and restart the access from the beginning.

Figure 4:
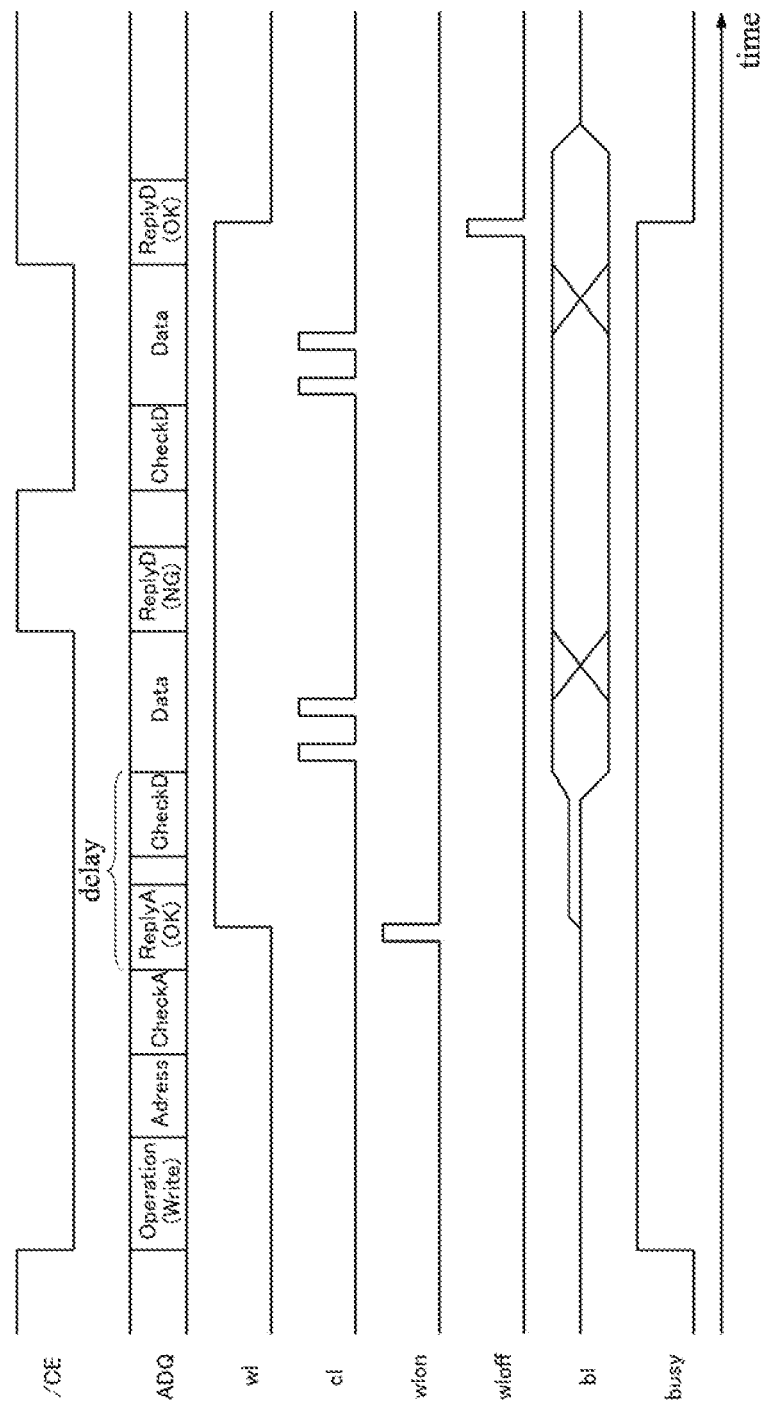
FIG. 4 shows a timing diagram of the signals within a semiconductor memory device over time when an error is included in the data.

Referring to FIG. 4, an example in which a write command is input from the memory controller 10 is explained.

First, when receiving the command, the address and the first check data from the memory controller 10, the semiconductor memory device 20 uses the first check data to perform the error detection of the command and the address. Additionally, the semiconductor memory device 20 asserts (into logic high level) the signal busy when the chip select signal /CE changes from negate (logic high level) into assert (logic low level).

Additionally, after sending the first response information (ReplyA(OK)) to the memory controller 10, the semiconductor memory device 20 uses the second check data to perform the error detection of the data to be written when receiving the second check data and the data to be written. Additionally, as described above, the semiconductor memory device 20 performs the write operation of the data to be written.

Herein, in the cases that an error is detected in the data to be written, when the chip select signal /CE is negate (logic high level), the semiconductor memory device 20 sends the fourth response information (ReplyD(NG)) indicating that an error has been detected in the data to be written to the memory controller 10. Additionally, in such cases, the semiconductor memory device 20 maintains the respective assert state of the signals wl and busy.

On the other hand, when receiving the fourth response information (ReplyD(NG)), the memory controller 10 re-sends the second check data and the data to be written to the semiconductor memory device 20.

When receiving the re-sent second check data and the data to be written, the semiconductor memory device 20 uses the second check data to perform the error detection of the data to be written. Additionally, the semiconductor memory device 20 performs the write operation of the data to be written again. Then, in the cases that no error is detected in the data to be written, the semiconductor memory device 20 sends the third response information (ReplyD(OK)) indicating that no error has been detected in the data to be written to the memory controller 10. Additionally, the semiconductor memory device 20 negates (into logic low level) the signals wl and busy respectively.

As such, according to the memory system related to the present embodiment, the persistence of the status that an error is included in the data to be read or write may be inhibited. Additionally, according to the memory system related to the present embodiment, even in the cases that an error is detected in the data, the semiconductor memory device 20 may continue the access associated with the writing of the data by waiting for the re-sending of the data. Furthermore, while waiting for the data to be re-sent, by maintaining the signal wl in assert state, such as in the cases that the command and the address are re-sent, the semiconductor memory device 20 may shorten the operation time due to the waiting time (delay) of waiting until the activation of the sense amplifier is eliminated.

Additionally, in the present embodiment, the description is based on the example in which only the data is re-sent when an error is detected in the data, but the present invention is not limited thereof. For example, the command may also be re-sent, the address corresponding to the row address signal ra and/or the column address signal ca may also be re-sent, and the command and the address may also be re-sent.

Furthermore, according to the memory system related to the present embodiment, when an error is detected in the data, the writing operation of the data may be performed again by the re-sending of the data from the memory controller 10.

Figure 5:
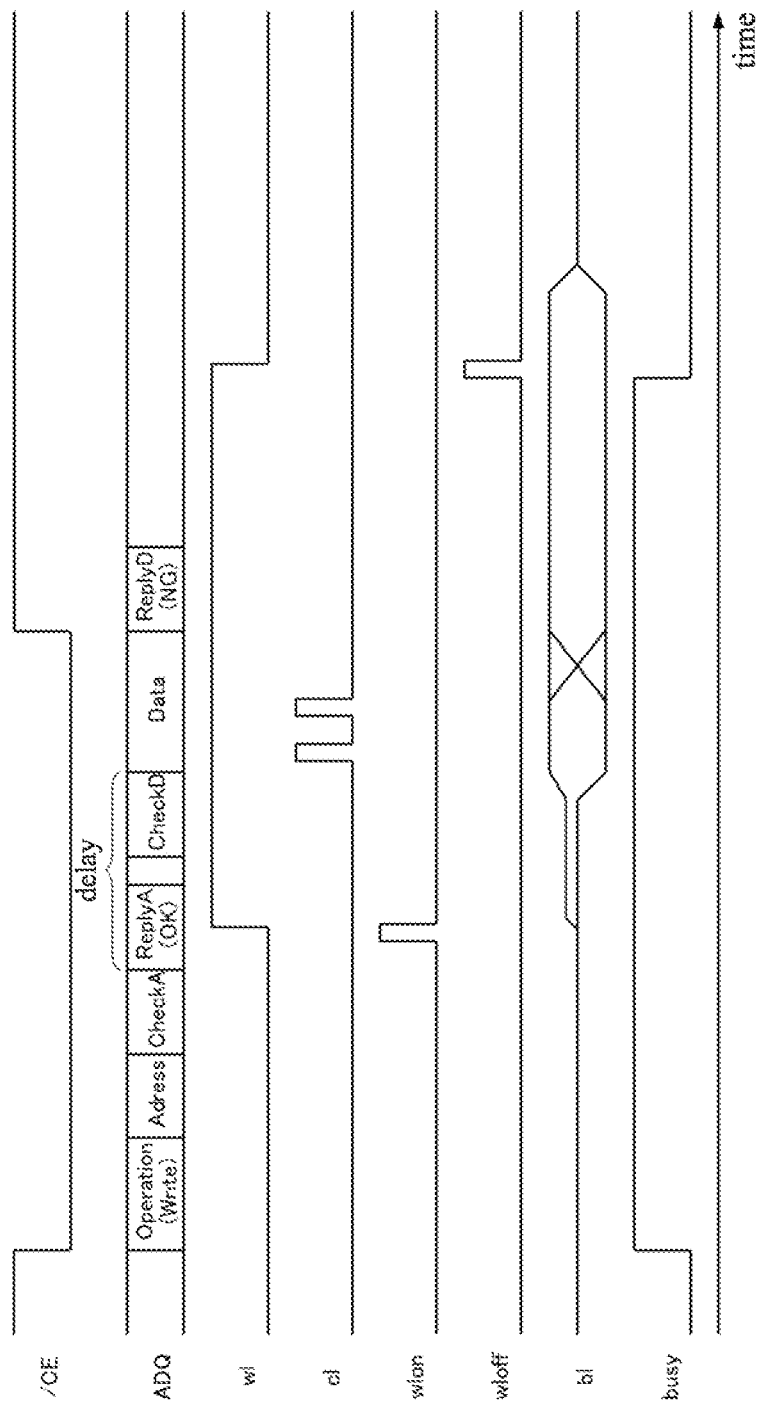
FIG. 5 shows a timing diagram of the signals within a semiconductor memory device over time when the specific time duration elapses while waiting for the data to be re-sent.

Referring to FIG. 5, an example in which a write command is input from the memory controller 10 is explained.

First, in the cases that an error is detected in the data to be written, when the chip select signal /CE is negated (logic high level), the semiconductor memory device 20 sends the fourth response information (ReplyD(NG)) indicating that an error has been detected in the data to be written to the memory controller 10. Additionally, the operation of the semiconductor memory device 20 before detecting an error in the data to be written is the same as the example associated with FIG. 4.

Herein, during the time period between the fourth response information (ReplyD(NG)) being sent to the memory controller 10 and the specific time duration elapsing, the semiconductor memory device 20 may also negate (into logic low level) the signals wl and busy respectively in the cases that no second check data and data to be written is received from the memory controller 10. Thus, the waiting status for the re-sending of the data to be written is relieved. Additionally, the semiconductor memory device 20 may also use a built-in timer circuit (omitted in the figure), or the like, to measure the elapsed time.

As such, according to the memory system related to the present embodiment, in the cases that no re-sent data is present, the semiconductor memory device 20 may process other read or write access by relieving the waiting for the re-sending of the data.

Figure 6:
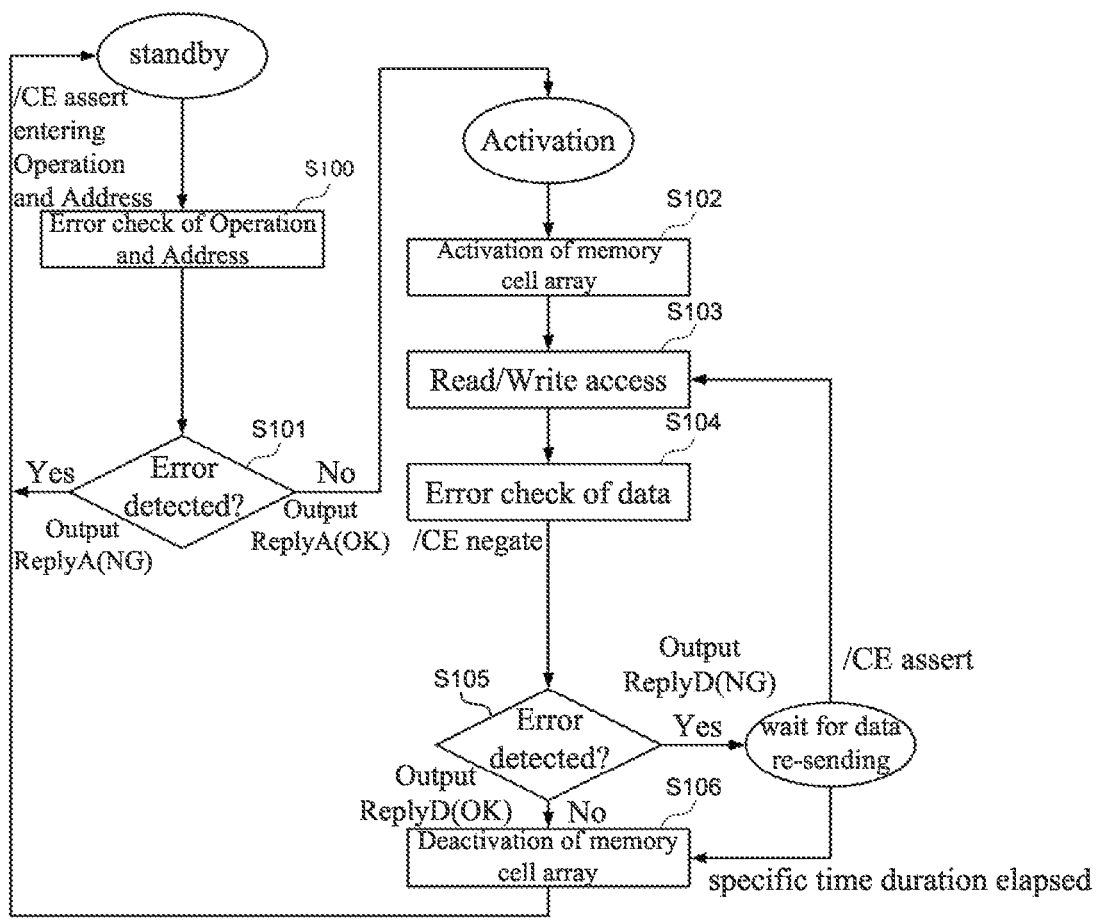
FIG. 6 shows a flow diagram illustrating an example of the operation of a semiconductor memory device.

Then, referring to FIG. 6, in a standby state, the semiconductor memory device 20 asserts (into logic low level) the chip select signal /CE, and uses the first check data to perform the error check of the command and the address when the command, the address and the first check data is input (step S100). Subsequently, when an error is detected (step S101; Yes), the semiconductor memory device 20 sends the second response information (ReplyA(NG)) to the memory controller 10 and moves to the standby state. On the other hand, when no error is detected (step S101; No), the semiconductor memory device 20 outputs the first response information (ReplyA(OK)) to the memory controller 10 and moves to an active state (Activation).

When the semiconductor memory device 20 moves to the active state (Activation), the activation of the memory cells 29 is performed (the activation of the word lines and bit lines) (step S102).

Then, the semiconductor memory device 20 performs read or write access based on the command and the address (step S103). Herein, in a write access, the semiconductor memory device 20 performs the write access after receiving the second check data and the data to be written.

Furthermore, the semiconductor memory device 20 uses the second check data to perform the error check of the data to be written (step S104).

Herein, when an error is detected in the data (step S105; Yes), the semiconductor memory device 20 sends the fourth response information (ReplyD(NG)) to the memory controller 10, and moves to the status of waiting for the re-sending of the data. Then, when the chip select signal/CE is asserted (logic low level), the semiconductor memory device 20 moves to step S103. On the other hand, when the specific time duration elapses while waiting for the re-sending of the data, the semiconductor memory device 20 moves to step S106 described below. When no error is detected in the data (step S105; No), the semiconductor memory device 20 outputs the third response information (ReplyD(OK)) to the memory controller 10, performs the deactivation of the memory cell array 29 (the deactivation of the word lines and bit lines) (step S106), and moves to the standby state.

As described above, according to the memory system related to the present embodiment, when receiving the first response information (ReplyA(OK)) indicating that no error has been detected in the command and the address from the semiconductor memory device 20, the memory controller 10 may send or receive the data to be read from or written into the address to/from the semiconductor memory device 20. Thus, during the sending of the command parcel, the semiconductor memory device 20 may be properly accessed due to the allowing of the inhibition of improper access from the change of the content of the command or the address. Additionally, according to the memory system related to the present embodiment, proper access of a pseudo-SRAM is allowed.

Second Embodiment

A second embodiment of the memory system of the present invention is described below, in which the semiconductor memory device 20 includes a plurality of memory banks accessed in an interleaved manner.

Figure 7:
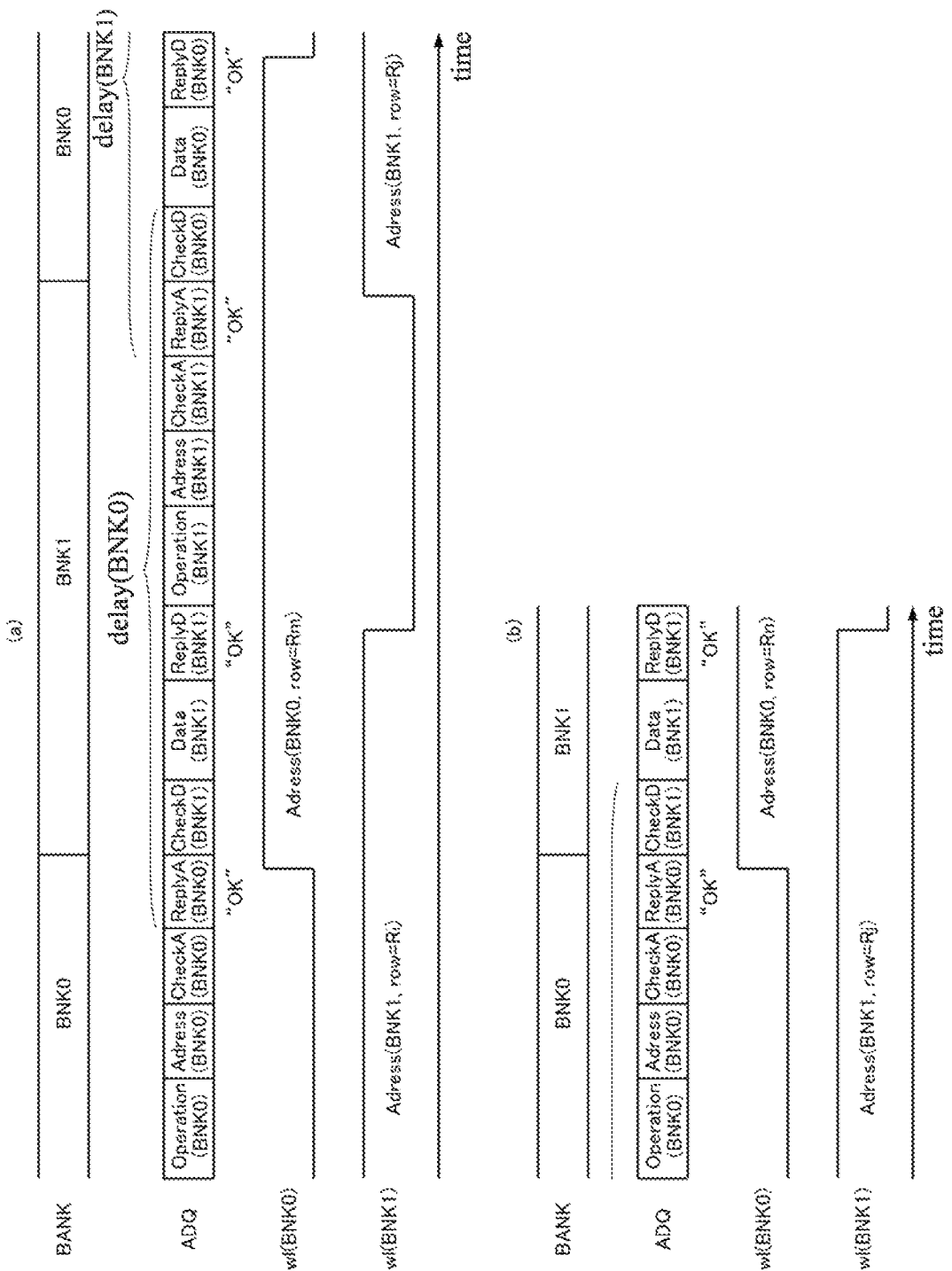
FIGS. 7 (a) and (b) shows a timing diagram of the signals within a semiconductor memory device over time of a memory system associated with a second embodiment of the present invention.
Figure 8:
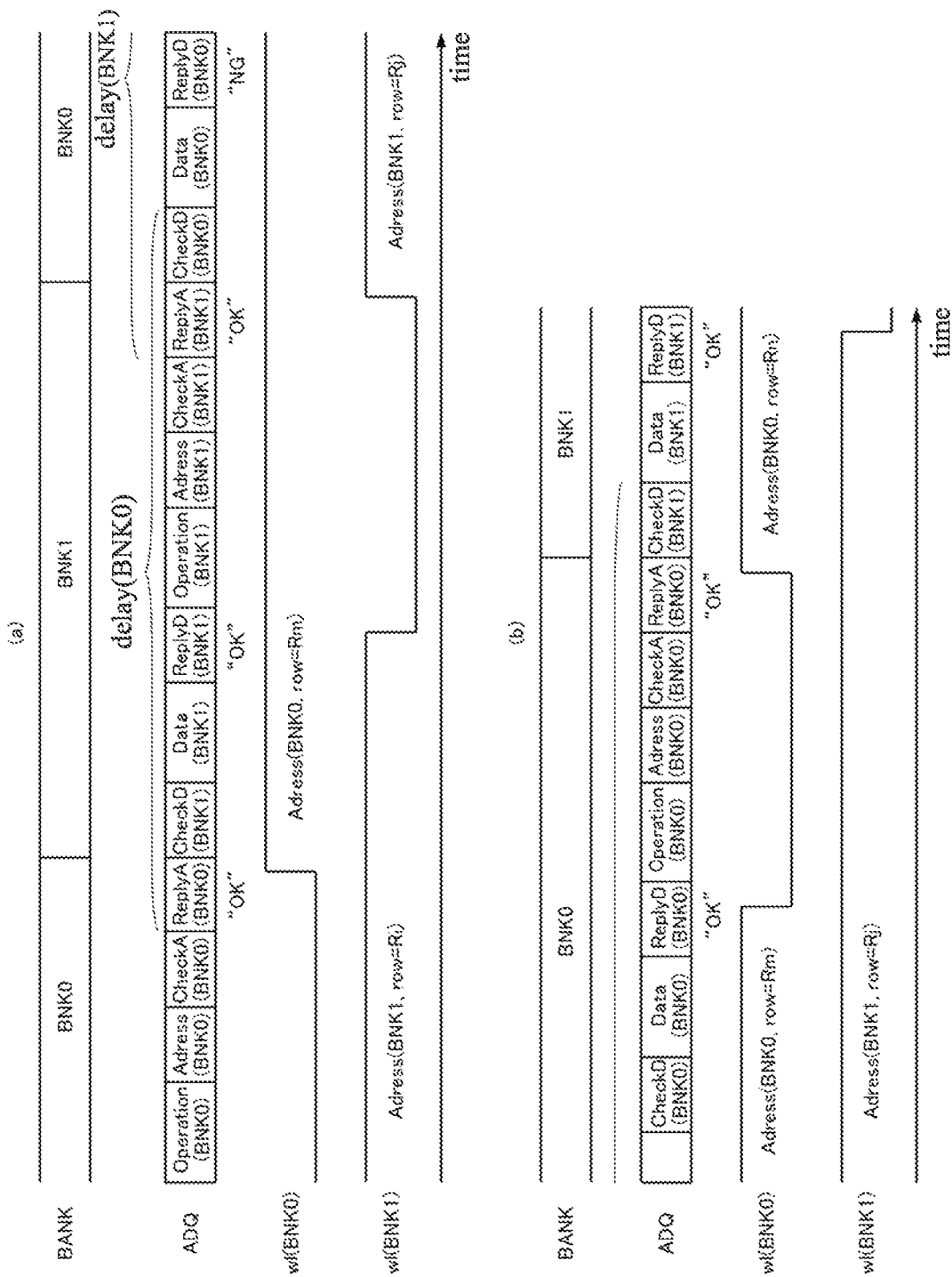
FIGS. 8 (a) and (b) shows a timing diagram of the signals within a semiconductor memory device over time.

Referring to FIGS. 7 and 8, the following description is based on an example in which the semiconductor memory device 20 includes two memory banks BNK0 and BNK1. In FIG. 7, the timing diagrams shown in 7(*a*) and 7(*b*) are successive, where 7(*b*) follows 7(*a*). Same in 8(*a*) and 8(*b*) of FIG. 8.

As shown in FIG. 7, the semiconductor memory device may be configured to be able to access memory bank (BNK1) during the delay from inputting a command (Operation(BNK0)), an address (Address(BNK0)) and a first check data (CheckA(BNK0)) towards the other memory bank (BNK0) till the input or output of data (Data(BNK0)).

As in the first embodiment, when no error is detected in the command (Operation(BNK0)) and the address (Address (BNK0)) of the memory bank (BNK0), the semiconductor memory device 20 asserts (into logic high level) a word line wl(BNK0) of a corresponding address (Address(BNK0, row=Rm)), where Rm indicates a row address and m is an integer.

Additionally, during the delay (delay(BNK0)) of the access of the memory bank (BNK0), the access of the other memory bank (BNK1) is performed. Here, during the access of the other memory bank (BNK1), the semiconductor memory device 20 performs the read or write operation of data (Data(BNK1)), the data (Data(BNK1)) corresponding to an address (Address(BNK1, row=Ri)) received before the delay of the access of the other memory bank (BNK1), where Ri indicates a row address and i is an integer. Then, when no error is detected in the data (Data(BNK1)), i.e. ReplyD(BNK1) is "OK", the semiconductor memory device 20 receives the next access command (Operation(BKN1)) and address (Address(BKN1, row=Rj)) for the other memory bank (BKN1), where Rj indicates a row address and j is an integer. Here, the semiconductor memory device 20 asserts (into logic high level) a word line wl(BNK1) of the corresponding address (Address(BKN1, row=Rj)).

Then, during the delay (delay(BNK1)) of the access of the other memory bank (BNK1), the semiconductor memory device 20 accesses the memory bank (BKN0). Here, during the access of the memory bank (BNK0), the semiconductor memory device 20 performs the read or write operation of data (Data(BNK0)), the data (Data(BNK0)) corresponding to the address (Address(BNK0, row=Rm)) received before the delay of the access of the memory bank (BNK0). Then, when no error is detected in the data (Data(BNK0)), i.e. ReplyD(BNK0) is "OK", the semiconductor memory device 20 receives the next access command (Operation(BKN0)) and address (Address(BKN0, row=Rn)) for the memory bank (BKN0), where Rn indicates a row address and n is an integer. Here, the semiconductor memory device 20 asserts (into logic high level) the word line wl(BNK0) of the corresponding address (Address(BKN0, row=Rn)).

As shown in FIG. 8, during the access of the memory bank (BKN0), when an error is detected in the data (Data (BKN0)), i.e. ReplyD(BKN0) is "NG", after receiving the data (Data(BNK0)) in which no error is detected, the semiconductor memory device 20 may extend the delay (delay (BKN1)) of the access of the other memory bank (BNK1) till receiving the next access command (Operation(BNK0)) and address (Address(BNK0, row=Rn)).

As described above, according to the memory system related to the present embodiment, being able to perform simultaneous parallel access to a plurality of memory banks, the access of the semiconductor memory device 20 is accelerated.

Third Embodiment

A third embodiment of the memory system of the present invention is described below, in which the semiconductor memory device 20 is configured to generate an update request internally to execute the update of the memory cells.

The semiconductor memory device 20 is configured to, from the generation of the update request signal till the execution of the update, when an error has been detected in the command, address, or data received from the memory controller 10, stop executing the update by re-sending the command, address, or data from the memory controller 10 until no error is detected.

Figure 9:
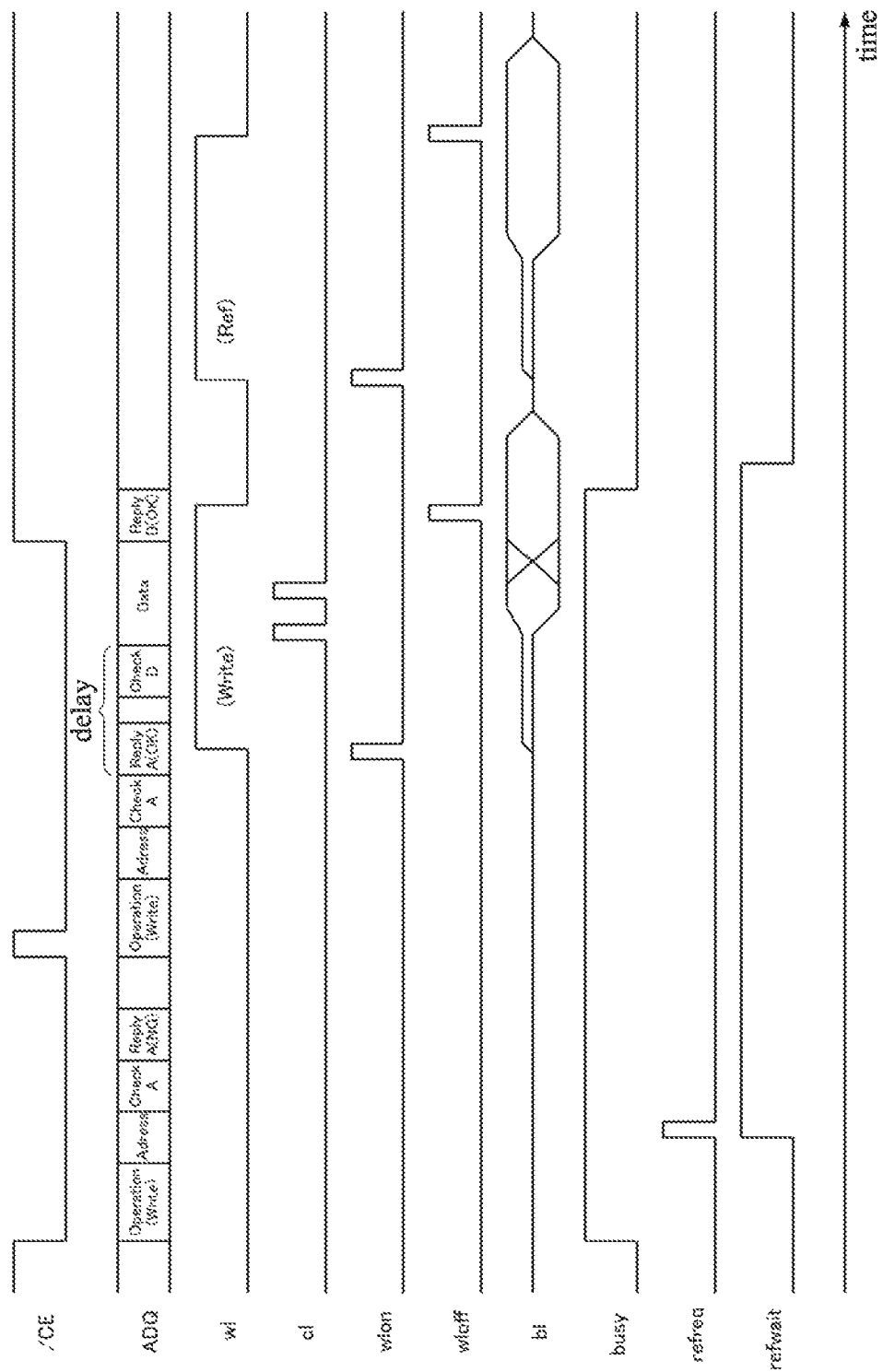
FIG. 9 shows a timing diagram of the signals within a semiconductor memory device over time of a memory system associated with a third embodiment of the present invention.

Referring to FIG. 9, the following description is based on an example in which a write command is input from the memory controller 10.

First, when the chip select signal /CE changes from negate (logic high level) to assert (logic low level), the semiconductor memory device 20 asserts (into logic high level) the signal busy. During the receiving of the command, address and first check data, the semiconductor memory device 20 asserts (into logic high level) a signal refwait for waiting the execution of the update when generating (asserting) an update request signal refreq internally. For example, the update request signal refreq and the signal refwait may also be generated by the command control part 22 of the semiconductor memory device 20.

Then, when an error is detected in the command and the address, the semiconductor memory device 20 sends the second response information (ReplyA(NG)) indicating that an error has been detected to the memory controller 10.

Then, when no error is detected in the command and the address re-sent from the memory controller 10, the semiconductor memory device 20 receives the data to be written from the memory controller 10 to perform the write operation of the received data to be written.

Subsequently, when no error is detected in the data to be written, i.e. the third response information (ReplyD(OK)) is sent to the memory controller 10, the semiconductor memory device 20 negates (into logic low level) the signal refwait. Additionally, the semiconductor memory device 20 performs the update when the signal refwait is negated (logic low level). Specifically, to activate the word line to be updated, the semiconductor memory device 20 asserts (into logic high level) the signal wl while asserting (into logic high level) the signal wlon. Additionally, to execute the update, the semiconductor memory device 20 asserts (into logic high level) the signal bl for activating the bit line. Then, the semiconductor memory device 20 executes the update. Additionally, when the update ends, the semiconductor memory device 20 negates (into logic low level) the signal wl while asserting (into logic high level) the signal wloff.

Although omitted in the figure, when an error is detected in the data, the semiconductor memory device 20 may also wait for the execution of the update (the signal refwait is asserted (logic high level)), until no error is detected in the data sent from the memory controller 10.

By stopping the execution of the update until no error is detected in the command, address, and data, the access delay due to the execution of the update may be inhibited.

Additionally, as an alternative example of the third embodiment, from the generation of the update request signal refreq till the execution of the update, the semiconductor memory device 20 may also send fifth response information indicating that the update is executed and execute the update, when an error is detected in the command, address, or data received from the memory controller 10.

Figure 10:
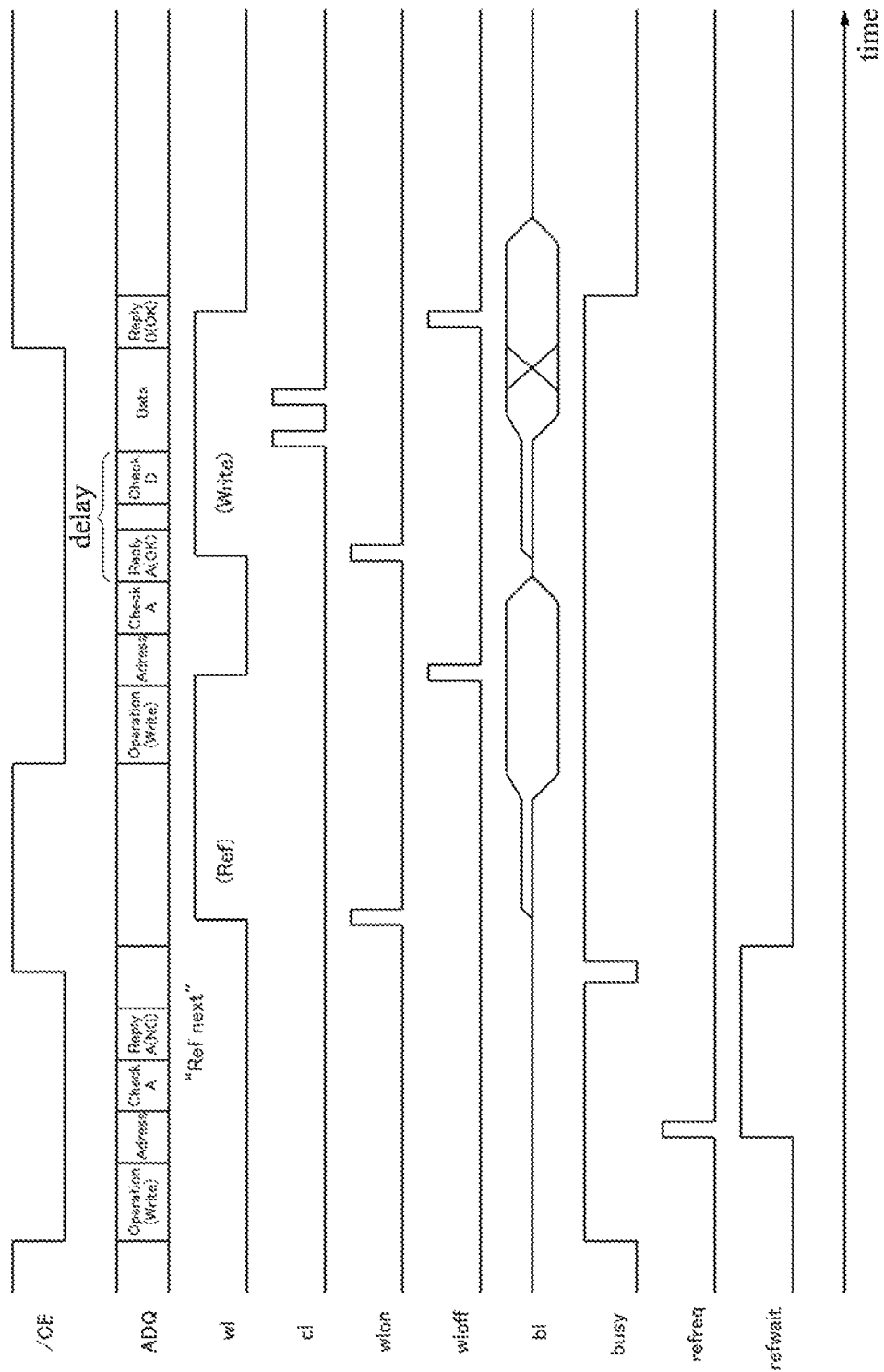
FIG. 10 shows a timing diagram of the signals within a semiconductor memory device over time.

Referring to FIG. 10, the following description is based on an example in which a write command is input from the memory controller 10.

First, when the chip select signal/CE changes from negate (logic high level) to assert (logic low level), the semiconductor memory device 20 asserts (into logic high level) the signal busy. Here, during receiving the command, address and first check data, the semiconductor memory device 20 asserts the signal refwait for waiting the execution of the update while generating (asserting) the update request signal refreq internally.

Then, when an error is detected in the command and address, the semiconductor memory device 20 sends the second response information (ReplyA(NG)) indicating that an error has been detected to the memory controller 10. Here, the second response information (ReplyA(NG)) may also include the fifth response information indicating that the update is executed (shown as "Ref next" in the figure).

On the other hand, when receiving the second response information (ReplyA(NG)) which includes the fifth response information ("Ref next"), the memory controller 10 may also consider executing the update within the semiconductor memory device 20 and wait for the sending of the next accessing command (Operation), address and first check data until the specific time duration elapses.

Then, the semiconductor memory device 20 negates (into logic low level) the signal busy once and then asserts (into logic high level) it. On the other hand, in response to the negated (logic low level) signal busy, the semiconductor memory device 20 starts to execute the update and negates (into logic low level) the signal refwait. Subsequently, the semiconductor memory device 20 performs the next accessing process after finishing the execution of the update.

By executing the update when an error is detected in the command, address, or data, for example, the memory data loss in the semiconductor memory device 20 due to the lack of execution of the update during the repetitive execution of the re-sending of any of the command, address and data may be inhibited.

In the foregoing embodiments, the description is based on an example in which the semiconductor memory device is a pSRAM. However, the present invention is not limited thereof. For example, the semiconductor memory device 20 may also be a DRAM, Flash memory or any other semiconductor memory device.

Additionally, in the foregoing embodiments, the description is based on an example in which the memory controller 10 sends the write command (Operation(Write)) to the semiconductor memory device 20. However, in cases where the memory controller 10 sends the read command (Operation(Read)) to the semiconductor memory device 20, the same effect as that of the foregoing embodiments may also be achieved.

The semiconductor memory device 20 (either the memory controller 10 or the semiconductor memory device 20) may also send the data to be read and the second check data for the error detection of the data to be read to the memory controller 10 (the other of the memory controller 10 or the semiconductor memory device 20). Additionally, when receiving the data to be read and the second check data for the error detection of the data to be read, the memory controller 10 may also use the second check data to perform the error detection of the data to be read, and send the third response information (ReplyD(OK)) indicating that no error has been detected in the data to be read to the semiconductor memory device 20, so as to confirm that the data to be read has properly arrived at the memory controller 10.

Additionally, when an error is detected in the data, the memory controller 10 (the other of the memory controller 10 or the semiconductor memory device 20) may also send the fourth response information (ReplyD(NG)) indicating that an error has been detected in the data to the semiconductor memory device 20 (the memory controller 10 or the semiconductor memory device 20), and wait for the re-sending of the data from the semiconductor memory device 20 until the specific time duration elapses. Even if an error is detected in the data, the memory controller 10 may continue the access associated with the read operation of the data by waiting for the re-sending of the data. Thus, the access performance is increased compared to cases where the read operation associated with the data is started from the beginning (when the command and address are re-sent).

Furthermore, when receiving the fourth response information (ReplyD(NG)), the semiconductor memory device 20 (the memory controller 10 or the semiconductor memory device 20) may also re-send the data and the second check data corresponding to the data to the memory controller 10 (the other of the memory controller 10 or the semiconductor memory device 20). Thus, when an error is detected in the data, the reading operation of the data may be performed again by re-sending the data from the semiconductor memory device 20.

Additionally, until the specific time duration elapses, if no data is re-sent from the semiconductor memory device 20 (the memory controller 10 or the semiconductor memory device 20), the memory controller 10 (the other of the memory controller 10 or the semiconductor memory device 20) may also relieve the waiting for the re-sending of the data. In such cases, when no re-sent data is present, the memory controller 10 may process other read or write access by relieving the waiting for the re-sending of the data, so as to increase the process performance of access.

Figure 11:
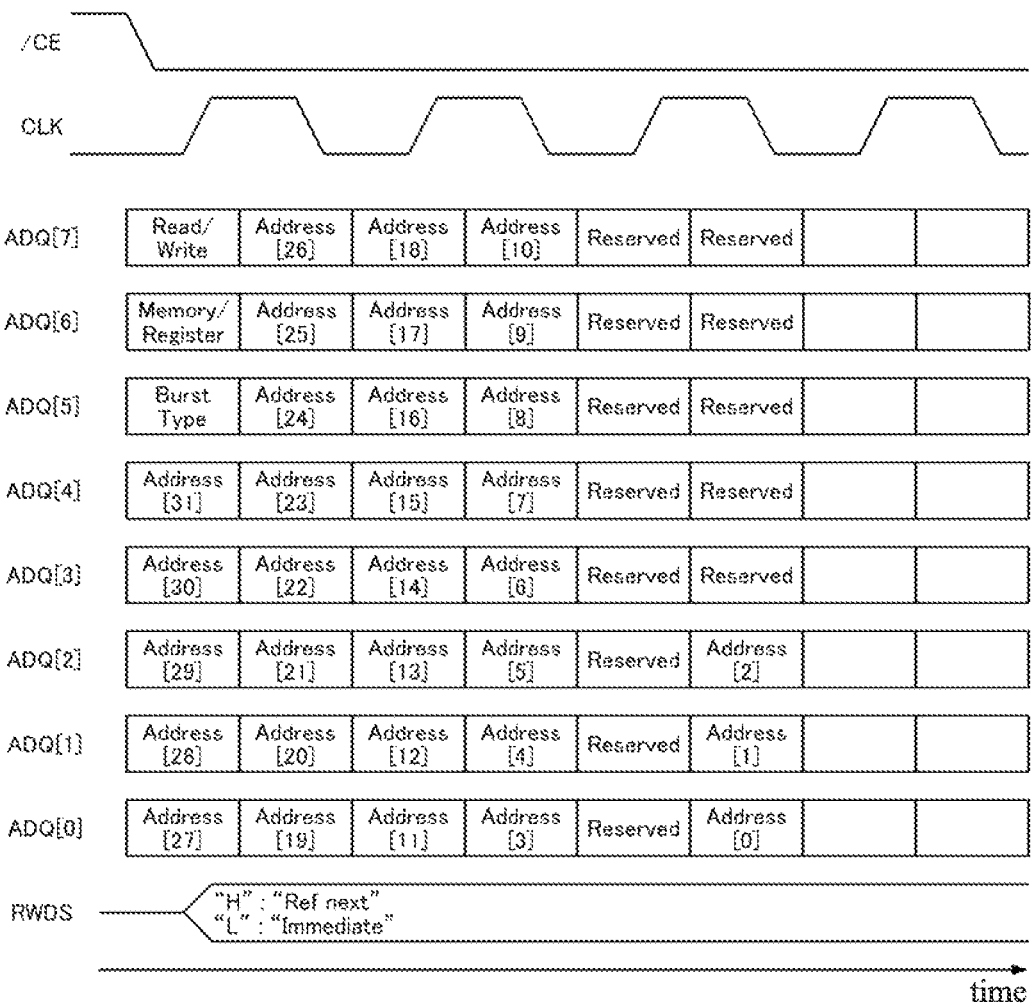
FIG. 11 shows a schematic diagram illustrating an example of the bit allocation of commands and addresses.

In the foregoing embodiments, the description is based on an example in which the first check data, the command and the address are sent separately. However, the present invention is not limited thereof. In FIG. 11, an example in which the bit partition of the command and the address is performed. Additionally, in this example, the semiconductor memory device 20 is assumed as a pSRAM.

In the example shown in FIG. 11, 8 bits of address data signals ADQ[7]-ADQ[0] are input during each rising edge and falling edge of an external clock signal CLK. The command is configured in the address data signals ADQ[7]-ADQ[5] input at the rising edge of the first external clock signal CLK, and the addresses Address[31]-Address[0] are configured in the address data signals ADQ input between the first external clock signal CLK and the third external clock signal CLK. Additionally, although the address data signals ADQ[7]-ADQ[0] input at the rising edge of the third external clock signal CLK and the address data signals ADQ[7]-ADQ[3] input at the falling edge of the third external clock signal CLK are reserved blocks, the blocks are unused. Here, at least part of the reserved blocks may also be used to configure the first check data. Thus, the semiconductor memory device 20 becomes able to simultaneously receive the first check data and the addresses. Furthermore, the first check data may also be configured in the address data signals ADQ input at the rising edge or falling edge of the fourth or later external clock signal CLK.

Additionally, a data strobe signal RWDS may also be configured to represent the fifth response information indicating that the update is executed. For example, when the data strobe signal RWDS is at logic high level ("H"), it may represent the fifth response information ("Ref next") indicating that the update is executed. On the other hand, when the data strobe signal RWDS is at logic low level ("L"), it may also represent a signal ("Immediate") indicating that the address data signals ADQ may be directly sent and received.

Figure 12:
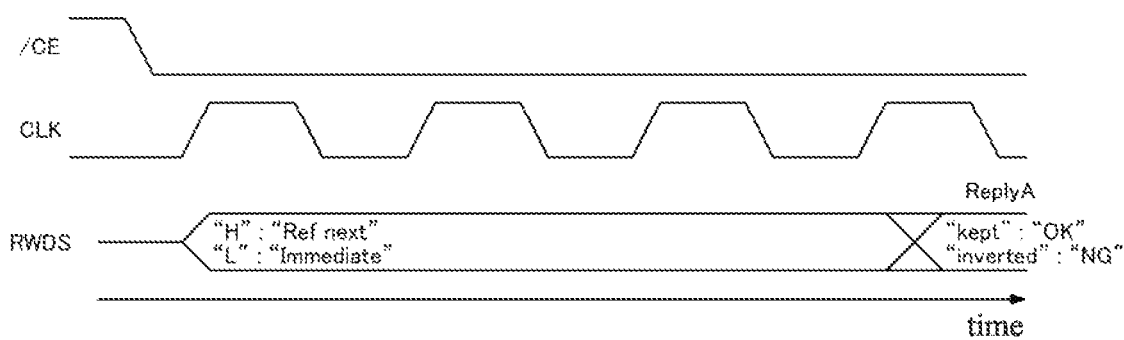
FIG. 12 shows a timing diagram of the data strobe signal over time.

As shown in FIG. 12, the data strobe signal RWDS may also be configured to represent the first response information (ReplyA(OK)) or the second response information (ReplyA (NG)). For example, at the rising edge of the fourth external clock signal CLK, when the logic level (high or low) of the data strobe signal RWDS is kept ("kept"), the data strobe signal RWDS may also represent the first response information (ReplyA(OK)). On the other hand, at the rising edge of the fourth external clock signal CLK, when the logic level (high or low) of the data strobe signal RWDS is inverted ("inverted"), the data strobe signal RWDS may also represent the second response information (ReplyA(NG)). Additionally, for example, the data strobe signal RWDS may also represent the first response information (ReplyA(OK)) or the second response information (ReplyA(NG)) in response to the state of the data strobe signal RWDS at the rising edge or the falling edge of the fifth external clock signal CLK.

What is claimed is:

1. A memory system, comprising:
a memory controller; and
a semiconductor memory device;
wherein the memory controller is configured to:
send a command, an address and first check data for error detection of the command and the address to the semiconductor memory device; and
when receiving first response information indicating that no error has been detected in the command and the address from the semiconductor memory device, based on the command, send to or receive from the semiconductor memory device of data to be read from or written into the address;
wherein the semiconductor memory device is configured to:
when receiving the command, the address and the first check data from the memory controller, use the first check data to perform error detection of the command and the address, and send the first response information to the memory controller when no error is detected in the command and the address; and
when no error is detected in the command and the address, based on the command, send to or receive from the memory controller of the data to be read from or written into the address;

wherein the memory controller or the semiconductor memory device is configured to:
send the data to be read or write and second check data for error detection of the data to the other of the memory controller or the semiconductor memory device; and the other of the memory controller or the semiconductor memory device is configured to:
when receiving the data and the second check data, use the second check data to perform error detection of the data, and send third response information indicating that no error has been detected in the data to the memory controller and the semiconductor memory device.

2. The memory system as claimed in claim 1, wherein the semiconductor memory device is configured to:
when an error is detected in the command or the address, send second response information indicating that an error has been detected in the command or the address to the memory controller;

wherein the memory controller is configured to:
when receiving the second response information from the semiconductor memory device, re-send the command and the address to the semiconductor memory device.

3. The memory system as claimed in claim 1, wherein:
the other of the memory controller or the semiconductor memory device is configured to:
when an error is detected in the data, send fourth response information indicating that an error has occurred in the data to the memory controller or the semiconductor memory device; and
wait for a re-sending of the data from the memory controller or the semiconductor memory device until a specific time duration elapses.

4. The memory system as claimed in claim 3, wherein:
the memory controller or the semiconductor memory device is configured to:
when receiving the fourth response information, re-send the data and the second check data corresponding to the data to the other of the memory controller or the semiconductor memory device.

5. The memory system as claimed in claim 3, wherein:
the other of the memory controller or the semiconductor memory device is configured to:
terminate the waiting for the data to be re-sent when the data is not re-sent from the memory controller or the semiconductor memory device until the specific time duration has elapsed.

6. The memory system as claimed in claim 1, wherein the semiconductor memory device further comprises a plurality of memory banks accessed in an interleaved manner.

7. The memory system as claimed in claim 1, wherein when the semiconductor memory device is configured to generate an update request signal internally for executing an update, the semiconductor memory device is configured to:
in the duration between the generation of the update request signal and the execution of the update,
upon an error being detected in the command, the address, or the data received from the memory controller,
stop the execution of the update by re-sending the command, the address, or the data from the memory controller until no error is detected.

8. The memory system as claimed in claim 1, wherein when the semiconductor memory device is configured to generate an update request signal internally for executing an update, the semiconductor memory device is configured to:
in the duration between the generation of the update request signal and the execution of the update,
upon an error being detected in the command, the address, or the data received from the memory controller,
send fifth response information indicating that the update is executed to the memory controller, and
execute the update.

9. The memory system as claimed in claim 1, wherein the semiconductor memory device is a pseudo-static random access memory.

10. A memory system, comprising:
a memory controller;
a semiconductor memory device;
wherein the memory controller is configured to:
send a command, an address and first check data for error detection of the command and the address to the semiconductor memory device; and
when receiving first response information indicating that no error has been detected in the command and the address from the semiconductor memory device, based on the command, send to or receive from the semiconductor memory device of data to be read from or written into the address;

wherein the semiconductor memory device is configured to:
when receiving the command, the address and the first check data from the memory controller, use the first check data to perform error detection of the command and the address, and send the first response information to the memory controller when no error is detected in the command and the address; and
when no error is detected in the command and the address, based on the command, send to or receive from the memory controller of the data to be read from or written into the address;

a request control part, generating a transform signal upon receiving a request for writing to or reading from the semiconductor memory device from a host device, wherein the transform signal transforms a transmitting mode of an address data signal sending and receiving between the memory controller and the semiconductor memory device; and a first serial control part, transforming the transmitting mode of the address data signal based on the transform signal.

11. The memory system as claimed in claim 10, wherein the first serial control part comprises:
a first serializer/deserializer, serializing or deserializing the address data signal based on the transform signal; and
a first error control part, using the command and the address to generate the first check data.

12. The memory system as claimed in claim 11, wherein the first serializer/deserializer is configured to:
when the request control part receives a write request, upon the transform signal being input from the request control part, generate a write command and the address, and send the write command and the address to the first error control part;
in response to the first check data of the generated write command and the address being input from the first error control part, send the generated write command, the address and the first check data to the semiconductor memory device as the address data signal; and when receiving the first response information indicating that no error has been detected in the generated write command and the address from the semiconductor memory device as the address data signal, output data-to-be-written received from the host device to the first error control part.

13. The memory system as claimed in claim 10, wherein the first error control part is configured to use the data-to-be-written to generate second check data for error detection of the data-to-be-written; and
wherein the first serializer/deserializer is configured to send the second check data and the data-to-be-written to the semiconductor memory device as the address data signal when the second check data is input from the first error control part.

14. The memory system as claimed in claim 10, wherein the first error control part is configured to generate a signal for re-sending the write command, the address and the first check data, upon receiving the second response information indicating that an error has been detected in the write command or the address as the address data signal.

15. The memory system as claimed in claim 14, wherein the first serializer/deserializer is configured to, when receiving the second response information from the semiconductor memory device as the address data signal, upon the signal for re-sending the write command, the address and the first check data being input from the first error control part, re-send the write command, the address and the first check data to the semiconductor memory device as the address data signal.

16. The memory system as claimed in claim 10, wherein the semiconductor memory device further comprises a second serial control part, transforming the transmission mode of the address data signal sent to or received from the memory controller;
wherein the second serial control part comprises:
a second serializer/deserializer, to serialize or deserialize the address data signal; and
a second error control part, using the first check data received from the memory controller to perform error detection of the command and the address.

17. The memory system as claimed in claim 16, wherein the second serializer/deserializer is configured to:
when receiving the command, the address and the first check data from the memory controller as the address data signal, transform the command, the address and the first check data into a serial transmission mode, and output the command, the address and the first check data to the second error control part;
when the first response information is input from the second error control part, transform the first response information into a parallel transmission mode, output the first response information to the memory controller as the address data signal, output a signal indicating the content of the command to a command control part which generates an internal command based on the command, and output a signal indicating the address to an address control part which controls an activation of a word line and a bit line corresponding to the address; and
when the second response information is input from the second error control part, transform the second response information into the parallel transmission mode, and send the second response information to the memory controller as the address data signal.

18. The memory system as claimed in claim 16, wherein:
the second error control part is configured to use the second check data for error detection of the data-to-be-written to perform error detection of the data-to-be-written; and
the second serializer/deserializer is configured to:
when receiving the data-to-be-written and the second check data for error detection of the data-to-be-written from the memory controller as the address data signal, output the data-to-be-written and the second check data to the second error control part; and
when the fourth response information indicating that an error has been detected in the data-to-be-written is input from the second error control part, send the fourth response information to the memory controller as the address data signal.

19. A memory system, comprising:
a memory controller; and
a semiconductor memory device;
wherein the memory controller is configured to:
send a command, an address and first check data for error detection of the command and the address to the semiconductor memory device; and
when receiving first response information indicating that no error has been detected in the command and the address from the semiconductor memory device, based on the command, send to or receive from the semiconductor memory device of data to be read from or written into the address;
wherein the semiconductor memory device is configured to:
when receiving the command, the address and the first check data from the memory controller, use the first check data to perform error detection of the command and the address, and send the first response information to the memory controller when no error is detected in the command and the address; and
when no error is detected in the command and the address, based on the command, send to or receive from the memory controller of the data to be read from or written into the address;
wherein when the semiconductor memory device is configured to generate an update request signal internally for executing an update, the semiconductor memory device is configured to:
in the duration between the generation of the update request signal and the execution of the update,
upon an error being detected in the command, the address, or the data received from the memory controller,
stop the execution of the update by re-sending the command, the address, or the data from the memory controller until no error is detected.

20. The memory system as claimed in claim 19, wherein when the semiconductor memory device is configured to generate an update request signal internally for executing an update, the semiconductor memory device is configured to:
in the duration between the generation of the update request signal and the execution of the update,
upon an error being detected in the command, the address, or the data received from the memory controller,
send fifth response information indicating that the update is executed to the memory controller, and
execute the update.

* * * * *